(12) United States Patent
Faber et al.

(10) Patent No.: US 11,283,446 B2
(45) Date of Patent: Mar. 22, 2022

(54) SENSOR ARRANGEMENT FOR CAPACITIVE POSITION DETECTION OF A HAND ON A STEERING WHEEL

(71) Applicant: IEE INTERNATIONAL ELECTRONICS & ENGINEERING S.A., Echternach (LU)

(72) Inventors: Thomas Faber, Schweich (DE); Gianluca Favalli, Aubange (BE); Heinrich Gierens, Trier (DE); Laurent Lamesch, Reichlange (LU); Michael Pütz, Trier (DE)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 17/296,918

(22) PCT Filed: Nov. 22, 2019

(86) PCT No.: PCT/EP2019/082314
§ 371 (c)(1),
(2) Date: May 25, 2021

(87) PCT Pub. No.: WO2020/109181
PCT Pub. Date: Jun. 4, 2020

(65) Prior Publication Data
US 2021/0359682 A1 Nov. 18, 2021

(30) Foreign Application Priority Data

Nov. 27, 2018 (LU) .................................. LU101018

(51) Int. Cl.
*H03K 17/96* (2006.01)
*B62D 1/04* (2006.01)
(Continued)

(52) U.S. Cl.
CPC ........... *H03K 17/962* (2013.01); *B62D 1/046* (2013.01); *B62D 1/06* (2013.01); *G01D 5/2417* (2013.01)

(58) Field of Classification Search
CPC ........ H03K 17/00; H03K 17/94; H03K 17/96; H03K 17/962; B62D 1/00; B62D 1/02;
(Continued)

(56) References Cited

U.S. PATENT DOCUMENTS 10,416,829 B1* 9/2019 Chang .................... G06F 3/0446
2012/0326735 A1 12/2012 Bennett et al.
(Continued)

OTHER PUBLICATIONS

International Search Report corresponding to International Application No. PCT/EP2019/082314, dated Feb. 12, 2020, 3 pages.
(Continued)

*Primary Examiner* — Hoai-An D. Nguyen
(74) *Attorney, Agent, or Firm* — Reising Ethington P.C.

(57) ABSTRACT

A sensor arrangement for capacitive position detection of a hand on a steering wheel. The sensor arrangement includes: a plurality of capacitive sensors disposed along a detection surface, which is an outer surface of the steering wheel, each sensor having at least one sensor electrode; and a measurement device electrically connected to the sensors. In order to increase the reliability of capacitive hand detection on a steering wheel, the measurement device is adapted to perform a sequence of detection operations, and in each detection operation, to activate at least one sensor by applying a detection signal to its at least one sensor electrode in order to capacitively detect the hand while grounding at least one other sensor by connecting at least one of its sensor electrodes to ground, and to activate different sensors in consecutive detection operations.

8 Claims, 2 Drawing Sheets

(51) Int. Cl.
*B62D 1/06* (2006.01)
*G01D 5/241* (2006.01)

(58) Field of Classification Search
CPC . B62D 1/04; B62D 1/046; B62D 1/06; G01D 5/00; G01D 5/12; G01D 5/14; G01D 5/24; G01D 5/241; G01D 5/2417
USPC ........ 324/600, 649, 658, 661, 662, 663, 686
See application file for complete search history.

(56) References Cited

U.S. PATENT DOCUMENTS

2015/0346906 A1* 12/2015 Komatsu ............. G06F 11/0745
345/174
2016/0370899 A1* 12/2016 Chang ................. G06F 3/04142

OTHER PUBLICATIONS

Written Opinion corresponding to International Application No. PCT/EP2019/082314, dated Feb. 12, 2020, 5 pages.

* cited by examiner

SENSOR ARRANGEMENT FOR CAPACITIVE POSITION DETECTION OF A HAND ON A STEERING WHEEL

TECHNICAL FIELD

The invention generally relates to a sensor arrangement for capacitive position detection of a hand on a steering wheel.

BACKGROUND

In modern vehicles, it can be necessary to detect whether the driver has his hands on the steering wheel (e.g. in order to determine whether the driver is ready to carry out a steering action). Steering assistants may include an active correction possibility for the driver to be used in certain circumstances. For example, a provision may be made for a steering assistance system to be activated only when the driver has his hands on the steering wheel. In most countries, it is mandatory that the vehicle when moving is under the control of the driver, even if modern assistance systems would be able to safely operate the vehicle autonomously in certain situations.

In order to identify whether or not at least one hand is positioned on the steering wheel, several concepts have been developed. One concept relies on the EPS system and induces a low-amplitude vibration in the steering wheel. If the hands of the driver are on the steering wheel, this has a dampening effect which can be detected. However, the vibration can be distracting or disturbing to the driver. Other systems use dedicated sensors. One such system uses resistive sensor elements where two conductors are disposed spaced apart under the surface of the steering wheel. If a certain pressure is exerted on the surface, the conductors are brought into contact. However, the amount of pressure required to activate the sensor makes this approach less reliable.

Another approach uses capacitive sensors, which detect a hand by its influence on an electric field generated by the sensor. Document US 2012/326735 A1 in particular discloses the use of three capacitive sensors disposed and configured to respectively detect contact with the front right side, front left side and rear surface of a steering wheel. The three sensors are simultaneously activated and one sensor records a contact when the impedance of said sensor is greater than or equal to a threshold impedance level. While capacitive sensors are more reliable than resistive sensors, the detection results for one hand of the user can be biased by a grounded condition of the other hand. If the other hand is grounded because the driver touches a grounded component of the vehicle, the total impedance differs considerably from a situation where the other hand is not grounded. In general, a detected signal is higher if the other hand is grounded. However, detecting the grounded condition of the other hand is difficult, not to mention estimating its influence on the detection signal. Other factors may also influence the detected signal, e.g. the driver seat position, making the measurement results less reliable.

SUMMARY

It is thus an object of the present invention to increase the reliability of capacitive hand detection on a steering wheel.

This problem may be solved by a sensor arrangement according to claim 1.

The sensor arrangement provides for capacitive position detection of a hand on a steering wheel. This refers to a steering wheel of a vehicle, normally a land vehicle like a car. However, application to other vehicles like sea or air vehicles is also conceivable. The sensor arrangement is designed to detect the presence of a hand of a driver, and, more specifically, to detect a position of the hand. The sensor arrangement is designed for capacitive detection, which means that the detection of the hand is based on measuring a capacitance or, respectively, a quantity that depends on a capacitance.

The sensor arrangement comprises a plurality of capacitive sensors disposed along a detection surface. The sensor arrangement may be adapted to detect an object like the hand adjacent to the detection surface. The detection surface is an outer surface of the steering wheel. The shape of the detection surface is not limited and may e.g. be plain, curved, angled or the like. Each sensor comprises at least one sensor electrode. Each of the sensor electrodes is at least partially made of conductive material, e.g. metal sheet, conductive foil or the like. Normally, they are flat or sheet-shaped, but other shapes are possible, e.g. a linear, straight or meandering shape. The electrodes of different sensors are electrically isolated from each other and may be disposed on an isolating substrate. If a sensor comprises a plurality of sensor electrodes, these electrodes may be physically distinct but can be electrically connected to a common electrical potential.

The sensor arrangement further comprises a measurement device that is electrically connected to the sensors. Normally, the measurement device is a single device, but it could also comprise a plurality of physically distinct devices which are interconnected. At least some functions of the measurement device can be software-implemented. Preferably, the measurement device has a separate, dedicated electrical connection to each sensor. If a sensor comprises a plurality of sensor electrodes, these may be separately connected to the measurement device or they may have a common connection to the measurement device. The electrical connection may be a conducting connection but it could also be a capacitive connection, i.e. the respective sensor could be coupled to the measurement device via a capacitance.

The measurement device is adapted to perform a sequence of detection operations, and in each detection operation, to activate at least one sensor by applying a detection signal to its at least one sensor electrode in order to capacitively detect the hand while grounding at least one other sensor by connecting its at least one sensor electrode to ground, and to activate different sensors in consecutive detection operations. The measurement device performs a sequence of detection operations, i.e. these detection operations are performed sequentially one after another. This includes the possibility that one detection operation does not immediately follow the previous detection operation but that there may be some time interval in between, like a pause. In each detection operation, at least one sensor is activated by the measurement device. A sensor is considered as "activated" if the measurement device applies a detection signal to this sensor. The detection signal can be a voltage signal or a current signal. The detection signal can be at least temporarily constant but is generally time-dependent, preferably alternating. The time-evolution (i.e. the "shape") of the detection signal is not limited; it could be e.g. a square signal, a pulse signal, a sawtooth signal, a sinusoidal signal or the like. The detection signal can even temporarily be zero, but it is nonzero at least for a part of the detection operation. If a sensor comprises a plurality of detection electrodes, the measurement device usually applies the same detection signal to all detection electrodes of this sensor. However, it is conceivable that different detection signals are applied to different detection electrodes of a single sensor. However, in such a case these electrodes could also be considered as belonging to different sensors.

The measurement device applies the detection signal in order to capacitively detect the hand. In other words, the measurement device detects or receives some response to the detection signal. If the detection signal is a voltage signal, the detection signal is normally a current signal and vice versa. The measurement device is adapted to detect the hand capacitively, i.e. at least partially based on the capacitance of the respective sensor. The detection may also be partially based on an ohmic resistance of the sensor with respect to ground, since the presence of a hand generally leads to ohmic losses. The measurement device detects a capacitance of the respective sensor or a value representative of the capacitance. Since the different sensors have different positions, the response to the detection signal is different for each sensor, depending on its position relative to the hand. Thus, the position of the hand can be detected based on the response to the detection signal from different sensors in different detection operations.

While at least one sensor is activated in each detection operation, at least one other sensor is grounded by the measurement device. This means that at least one sensor electrode of this sensor is connected to ground potential. Usually, the at least one sensor electrode of this sensor (i.e. all sensor electrodes of this sensor) is connected to ground potential. In a vehicle like a car, this usually means that the sensor electrode is conductingly connected (either directly or indirectly) to the chassis of the vehicle or, more generally, to the vehicle body. The connection to ground potential may be applied via the measurement device, i.e. the ground connection may be routed through the measurement device. The different sensors are normally comparatively close together as compared to the distance between one of the sensors and some "external" ground connection of the hand. For instance, the external ground connection could be a ground connection via the other hand. If there is such an external ground connection, the response of the at least one activated sensor to the detection signal could be influenced by the external ground connection as well as by the "internal" ground connection via the at least one grounded sensor. However, mostly due to the relatively short distance between the activated sensor and the grounded sensor, one can expect that the influence of the external ground connection is comparatively small. One could also say that there is a first current loop via the (at least one) activated sensor and the (at least one) grounded sensor and a second current loop via the activated sensor and the external ground connection. In most cases, the first current loop can be considered as a low impedance loop, while the second impedance loop generally has a comparable or higher impedance. The total arrangement can be considered as a parallel connection of the two impedance loops which is dominated by the low impedance loop.

Preferably, the sensors are offset with respect to each other along the detection surface. In other words, no two different sensors have the same position with respect to the detection surface. However, different sensors could overlap with respect to the detection surface and be disposed at a different position perpendicular to the detection surface, i.e. at a different depth underneath the detection surface.

More preferably, at least some of the sensors are spaced from each other along the detection surface, so that each sensor corresponds to a sensor area on the detection surface. In this case, the different sensors do not overlap with respect to the detection surface. If the sensors comprise more than one sensor electrode, this includes the possibility that sensor electrodes of different sensors are disposed alternatingly. In other words, the sensor area of a specific sensor does not have to be coherent, but it could comprise several subareas. The spacing between individual sensors can have different sizes. It could be small, e.g. less than 10% of a linear dimension of an individual sensor. It could also be large, possibly larger than the linear dimension of the sensor. However, depending on the detection surface where the sensors are disposed and on the intended application, the spacing could be chosen to be less than a typical dimension of the hand, thus ensuring that the hand cannot be placed between two sensors and thus remain undetected. For example, the spacing could be less than 10 cm or less than 5 cm. While the above-mentioned sensors are spaced from each other along the detection surface, it is additionally possible that they are disposed in at different positions perpendicular to the detection surface, i.e. in different depths.

As mentioned above, at least some sensors may comprise a plurality of sensor electrodes, possibly even in complex configurations like sensor electrodes of different sensors being alternatingly disposed. It is generally sufficient, though, that each sensor comprises a single sensor electrode. This decreases the complexity of the entire sensor arrangement and allows to reduce costs.

There are numerous ways how the measurement device could control the different sensors. According to one preferred embodiment, the measurement device is adapted to ground at the end of each detection operation at least one sensor that was activated during this detection operation and to activate a different sensor for the next detection operation. One could also say that a sensor is activated in one detection operation and in the next detection operation, this sensor is grounded. In place of this sensor, as one could say, a different sensor is activated in the next detection operation. This includes the possibility that the number of sensors that are grounded differs from the number of sensors that are activated in the next detection operation. For example, in one detection operation, three sensors could be activated, which are afterwards grounded in the next detection operation, while only two sensors are activated, i.e. the number of activated sensors decreases. It could also be the other way around, i.e. the number of activated sensors could increase from one detection operation to the next. It is most common, though, that the number of activated sensors is the same in each detection operation.

In particular, the measurement device can be adapted to activate a single sensor at a time. In other words, only one sensor is activated at a given time. This can advantageously be combined with the above-mentioned embodiment, so that for each detection operation, one sensor is activated, while for the next detection operation, this sensor is grounded and a different sensor is activated.

Alternatively, the measurement device can be adapted to activate a plurality of sensors at a time. In other words, several sensors are activated at a given time. This can advantageously be combined with the above-mentioned embodiment, so that for each detection operation, a group of sensors is activated, while for the next detection operation, at least one sensor of this group is grounded and at least one different sensor is activated.

To some part depending on the configuration of the sensors and/or the required detection accuracy, it may be possible that some sensors have a potential differing from ground potential, e.g. an undefined potential. For example, if such a sensor with an undefined potential is far away from a single activated sensor, while one or several grounded sensors are disposed in the proximity of the activated sensor, the undefined potential may not have a serious detrimental effect on the detection accuracy. In some embodiments, it may even be advantageous that at least one sensor is not activated but has a potential different from ground potential. It is even possible to switch the potential of a sensor that is not activated between ground potential and a different, possibly undefined, potential. In other embodiments, the measurement device is preferably adapted to ground every sensor that is not activated. In other words, at all times, every sensor is either activated or grounded.

BRIEF DESCRIPTION OF THE DRAWINGS

Further details and advantages of the present invention will be apparent from the following detailed description of not limiting embodiments with reference to the attached drawing, wherein.

DESCRIPTION OF EMBODIMENTS

Figure 1:
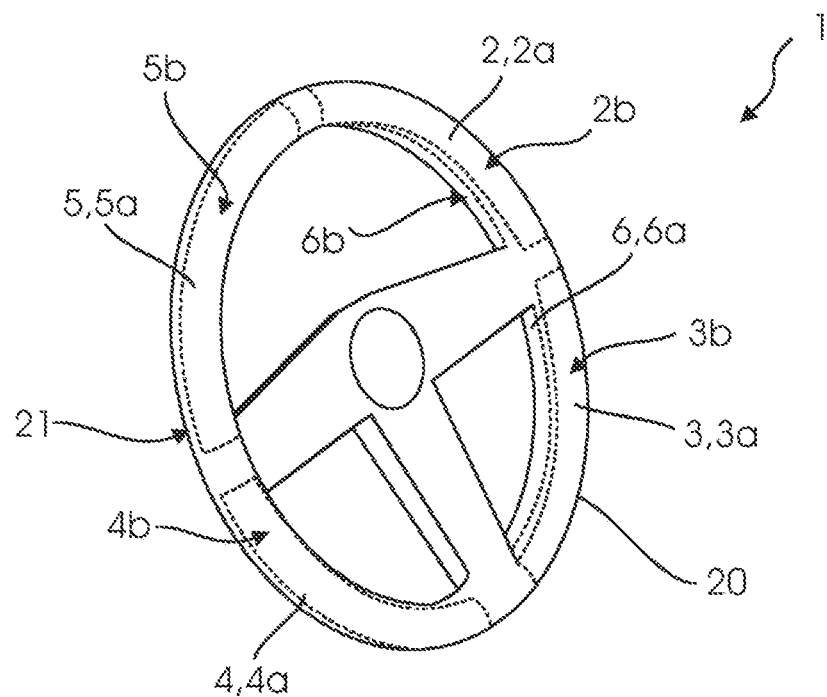
FIG. 1 is a schematic view of a steering wheel with an inventive sensor arrangement.

FIG. 1 schematically shows a steering wheel 20 with an inventive sensor arrangement 1, which may be used for hand position detection on the steering wheel 20. The sensor arrangement 1 comprises a plurality of sensors 2-6 disposed along a surface 21 of the steering wheel 20. In this embodiment, each sensor 2-6 comprises a single sensor electrode 2a-6a, but optionally at least one sensor 2-6 could comprise a plurality of sensor electrodes 2a-6a. Each sensor electrode 2a-6a is made of conductive material, e.g. metal foil, which is disposed on an electrically isolating substrate and covered by an electrically isolating lining of the steering wheel 20. The sensor electrodes 2a-6a of different sensors 2-6 are disposed spaced apart along the surface 21 of the steering wheel 20, wherein the spacing should be less than a typical dimension of a hand 31 to be detected. Each sensor 2-6 therefore corresponds to a distinct sensor area 2b-6b on the surface 21. For sake of simplicity, the present embodiment of the sensor arrangement 1 comprises five sensors 2-6 corresponding to five sensor areas 2b-6b and a total of five sensor electrodes 2a-6a. It is understood, though, that the number of sensors 2-6 and sensor areas 2b-6b could be higher or possibly lower. Four sensor areas 2b-5b are disposed on a front side of the steering wheel 20 while a fifth sensor area 6b is disposed on a backside of the steering wheel 20. The first four sensors 2a-5a allow for an (approximate) detection of the angular position of the hand 31 around the circumference of the steering wheel 30, while the fifth sensor 6a allows to determine whether the driver 30 has placed his hand 31 around the steering wheel 20.

Figure 2:
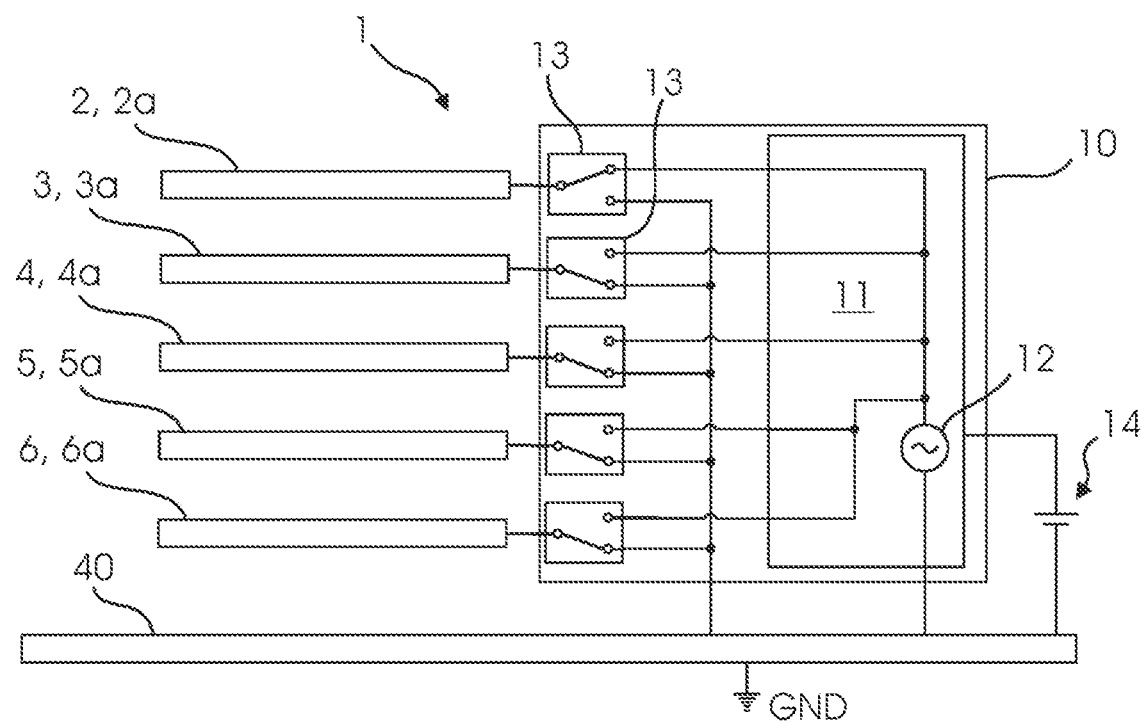
FIG. 2 is a circuit diagram of the sensor arrangement of FIG. 1.

Each of the sensors 2-6 is separately connected to a measurement device 10, i.e. the measurement device 10 has a dedicated electrical connection to each of the sensors 2-6, as can be seen in FIG. 2. The measurement device 10, which comprises a microcontroller 11, is connected to a car battery 14 for power supply and comprises an AC voltage source 12. By individual switches 13, each sensor 2-6 can selectively be connected to either the AC voltage source 12 or to a grounded component 40, like a part of the vehicle body. The measurement device 10 is adapted to perform a sequence of detection operations that are performed one after another, optionally with a pause in between. The time interval for each detection operation may be e.g. between several milliseconds and several seconds. In each detection operation, the measurement device 10 activates one sensor 2-6 and grounds all other sensors 2-6 by operating the switches 13. For example, in a first detection operation, the measurement device 10 activates a first sensor 2 and grounds the second to fifth sensor 3-6. In other words, the measurement device 10 applies a detection signal, e.g. an alternating voltage signal, to the first sensor 2 and connects the remaining sensors 3-6 to ground potential. Also, the measurement device 10 detects a response to the detection signal, e.g. a current flowing to the first sensor 2. This current in general depends on the impedance between the first sensor 2 and ground.

Figure 3:
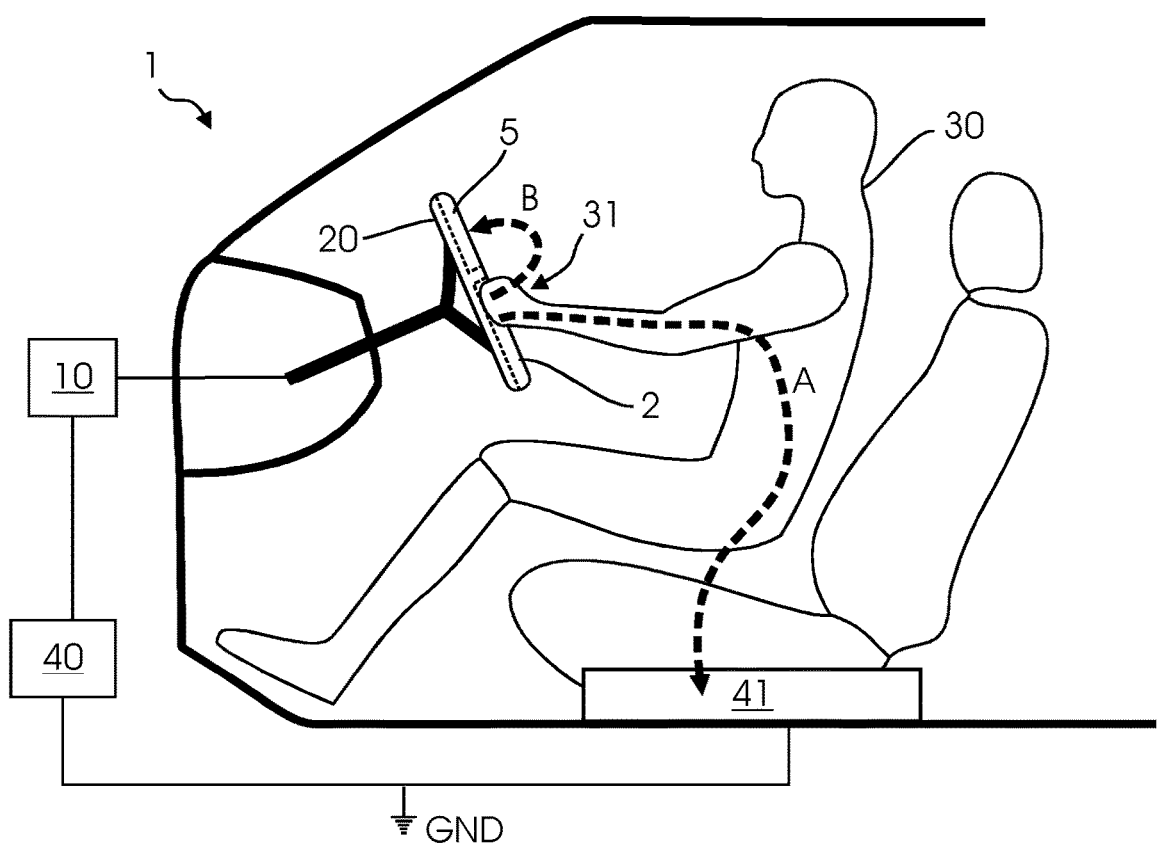
FIG. 3 is a schematic view of a vehicle with the sensor arrangement of FIG. 1.

As schematically shown in FIG. 3, this impedance is influenced by two current loops A, B. A first current loop A exists between the activated first sensor 2, the hand 31 of the driver 30 and each of the grounded sensors 3-6. For sake of simplicity, the fifth sensor 6 is not shown in FIG. 3. A second current loop B exists between the activated first sensor 2, the body of the driver 30 and a grounded component 41 of the vehicle, e.g. a seat rail. In general, the impedance of the second current loop B largely depends on the seat position, the posture of the driver 30 and if he is touching a grounded component 41, e.g. with a second hand that is not on the steering wheel 20. The measurement result by the measurement device 10 is influenced by both impedances. However, largely due to the proximity of the grounded sensors 3-6 to the activated sensor 2, the first current loop A generally has a lower impedance, wherefore the total impedance is dominated by the first current loop A. Therefore, the influence of an external grounded component 41 is minor and the measurement device 10 can detect with higher reliability whether the hand 31 of the driver 30 is on the first sensor area 2b corresponding to the first sensor 2.

In a second detection operation, the first sensor 2 is grounded and the third to fifth sensor 4-6 remain grounded. The second sensor 3, on the other hand, is activated, i.e. the measurement device 10 applies a detection signal to the electrode 3a of the second sensor 3. Again, the reliability of the measurement result is increased by the fact that the first, third, fourth and fifth sensor 2, 4, 5, 6 are grounded, thereby creating a first current loop A like in the previous detection operation. In the following detection operations, the measurement device 10 can sequentially activate the third, fourth and fifth sensor 4, 5, 6, respectively, while at the same time grounding the remaining sensors 2-6. The accuracy of each detection operation is enhanced by the fact that the total impedance is dominated by the first current loop A.

As an alternative to the above-mentioned process where a single sensor 2-6 is activated and all other sensors 2-6 are grounded, several other approaches are conceivable. For example, two sensors 2-6 could be activated simultaneously, for example the first and second sensor 2, 3 during the first detection operation, the second and third sensor 3, 4 during the second detection operation and so on, while all other sensors 2-6 are grounded. Another alternative would be to activate one sensor 2-6 at a time, but only ground one or some of the remaining sensors 2-6. For example, when the first sensor 2 is activated, only its neighboring sensors, i.e.

the second, fourth and fifth sensor 3, 5, 6, are grounded. The third sensor 4 could have any different, possibly undefined, potential. Yet another alternative that may also be sufficient to increase the reliability of the detection operation would be to activate a single sensor 2-6 while grounding only one of its neighboring sensors 2-6.

The invention claimed is:

1. A sensor arrangement for capacitive position detection of a hand on a steering wheel, comprising:
- a plurality of capacitive sensors disposed along a detection surface, which is an outer surface of the steering wheel, each sensor comprising at least one sensor electrode; and
- a measurement device electrically connected to the sensors,
- wherein the measurement device is adapted to perform a sequence of detection operations, and in each detection operation, to activate at least one sensor by applying a detection signal to its at least one sensor electrode in order to capacitively detect the hand while grounding at least one other sensor by connecting at least one of its sensor electrodes to ground, and to activate different sensors in consecutive detection operations.

2. A sensor arrangement according to claim 1, wherein the sensors are offset with respect to each other along the detection surface.

3. A sensor arrangement according to claim 1, wherein at least some of the sensors are spaced from each other along the detection surface, so that each sensor corresponds to a sensor area on the detection surface.

4. A sensor arrangement according to claim 1, wherein each sensor comprises a single sensor electrode.

5. A sensor arrangement according to claim 1, wherein the measurement device is adapted to ground at the end of each detection operation at least one sensor that was activated during this detection operation and to activate a different sensor for the next detection operation.

6. A sensor arrangement according to claim 1, wherein the measurement device is adapted to activate a single sensor at a time.

7. A sensor arrangement according to claim 1, wherein the measurement device is adapted to activate a plurality of sensors at a time.

8. A sensor arrangement according to claim 1, wherein the measurement device is adapted to ground every sensor that is not activated.

\* \* \* \* \*